(12) United States Patent
Gajanayake et al.

(10) Patent No.: US 10,338,143 B2
(45) Date of Patent: Jul. 2, 2019

(54) METHOD AND APPARATUS FOR DIAGNOSING A FAULT CONDITION IN AN ELECTRIC MACHINE

(71) Applicant: ROLLS-ROYCE plc, London (GB)

(72) Inventors: Chandana J Gajanayake, Singapore (SG); Sivakumar Nadarajan, Singapore (SG); Amit K Gupta, Singapore (SG); Chao Bi, Singapore (SG); Nay Lin Htun Aung, Singapore (SG); Jiang Quan, Singapore (SG)

(73) Assignee: ROLLS-ROYCE plc, London (GB)

( * ) Notice: Subject to any disclaimer, the term of this patent is extended or adjusted under 35 U.S.C. 154(b) by 86 days.

(21) Appl. No.: 15/653,054

(22) Filed: Jul. 18, 2017

(65) Prior Publication Data

US 2018/0045784 A1 Feb. 15, 2018

(30) Foreign Application Priority Data

Aug. 9, 2016 (GB) .................................. 1613617.8

(51) Int. Cl.
*G01R 31/00* (2006.01)
*G01R 31/34* (2006.01)
*G01R 23/16* (2006.01)
*G01R 33/09* (2006.01)
*G01R 33/12* (2006.01)

(52) U.S. Cl.
CPC ........... *G01R 31/343* (2013.01); *G01R 23/16* (2013.01); *G01R 33/09* (2013.01); *G01R 33/1215* (2013.01)

(58) Field of Classification Search
CPC .................................................. G01R 31/343

USPC ........................................................... 702/58
See application file for complete search history.

(56) References Cited

U.S. PATENT DOCUMENTS

| 4,794,291 | A | * | 12/1988 | Abukawa | ............... | H02K 23/04 |
|---|---|---|---|---|---|---|
| | | | | | | 310/154.26 |
| 5,650,706 | A | * | 7/1997 | Yamada | ............. | B60L 11/1803 |
| | | | | | | 318/400.17 |
| 5,739,698 | A | | 4/1998 | Bowers et al. | | |
| 8,314,576 | B2 | | 11/2012 | Fahimi et al. | | |
| 8,896,259 | B2 | | 11/2014 | Kauppinen et al. | | |
| 2003/0055584 | A1 | | 3/2003 | Raftari et al. | | |

(Continued)

FOREIGN PATENT DOCUMENTS

EP          2511722 A2     10/2012

OTHER PUBLICATIONS

Dec. 18, 2017 Extended Search Report issued in European Patent Application No. 17181633.3.

(Continued)

*Primary Examiner* — Hien D Khuu
(74) *Attorney, Agent, or Firm* — Oliff PLC

(57) ABSTRACT

A fault condition is diagnosed in an electric machine that includes a rotor and a plurality of permanent magnets. To do so, the rotor is rotated so that each of the plurality of permanent magnets passes a magnetic flux density sensor, and the values of magnetic flux density are measured using the magnetic flux density sensor at a plurality of positions of the rotor. The measured values of magnetic flux density are analyzed and a magnitude of a peak amplitude is compared in a time or frequency domain with a reference value. If the peak amplitude is below the reference value, the electric machine is determined to have a fault condition.

20 Claims, 12 Drawing Sheets

(56) References Cited

U.S. PATENT DOCUMENTS

| | | | |
|---|---|---|---|
| 2004/0150283 A1* | 8/2004 | Calfo | H02K 1/2766 |
| | | | 310/156.55 |
| 2005/0046414 A1 | 3/2005 | Payne et al. | |
| 2011/0108369 A1 | 5/2011 | Stolt et al. | |
| 2012/0074879 A1* | 3/2012 | Fahimi | H02P 23/14 |
| | | | 318/400.04 |
| 2012/0286713 A1 | 11/2012 | Kauppinen et al. | |
| 2013/0033215 A1 | 2/2013 | Krishnamurthy et al. | |
| 2014/0009186 A1 | 1/2014 | Kassner et al. | |
| 2014/0049285 A1* | 2/2014 | Rodriguez | G01H 1/003 |
| | | | 324/765.01 |
| 2014/0054997 A1* | 2/2014 | Miyashita | H02K 1/276 |
| | | | 310/156.01 |
| 2015/0372548 A1* | 12/2015 | Nigo | H02K 21/16 |
| | | | 310/156.01 |

OTHER PUBLICATIONS

Jan. 4, 2017 Search Report issued in British Patent Application No. 1613617.8.

Da,Yao et al. "Novel Fault Diagnostic Technique for Permannent Magnet Synchronous Machines Using Electromagnetic Signature Analysis." Electric Drives and Energy Conversion Laboratory, Electrical and Computer Engineering Department, Illinois Insitiute of Technology.

Caruso, Michael. "Applications of Magnetoresistive Sensors in Navigation Systems", Honeywell Inc.

* cited by examiner

METHOD AND APPARATUS FOR DIAGNOSING A FAULT CONDITION IN AN ELECTRIC MACHINE

The disclosure relates to a method and apparatus for diagnosing a fault condition in an electric machine.

Permanent Magnet Synchronous Machines (PMSMs) are a well-known type of electric machine. PMSMs are high-accuracy machines, and exhibit high power density, high efficiency, rapid response and high overload capacity. Nevertheless, PMSMs can suffer from faults such as demagnetisation, bearing failure, eccentricity and winding short circuit.

It is therefore desirable to provide a method and apparatus for diagnosing a fault condition in an electric machine, such as a PMSM.

According to an aspect of the disclosure, there is provided a fault diagnosis apparatus for diagnosing a fault condition in an electric machine, the electric machine comprising a rotor having an axis of rotation and comprising a plurality of permanent magnets, the fault diagnosis apparatus comprising: a magnetic flux density sensor which is configured such that rotation of the rotor causes each of the plurality of permanent magnets to pass the magnetic flux density sensor; and a processor configured to: measure values of magnetic flux density using the magnetic flux density sensor at a plurality of positions of the rotor; analyse the measured values of magnetic flux density and compare a magnitude of a peak amplitude in a time or frequency domain with a reference value; and, if the peak amplitude is below the reference value, determine that the electric machine has a fault condition. The processor may be additionally configured to: determine the difference between the magnitude of the peak amplitude and the reference value. If the electric machine is determined to have a fault condition, the severity of the fault condition may be determined based on the difference.

The fault condition may be demagnetisation.

The processor may be configured to compare the magnitude of a peak amplitude in a time domain with the reference value. The measured values of magnetic flux density may define a plurality of peak amplitudes, each peak amplitude corresponding to one or an adjacent pair of the permanent magnets. The processor may also be configured to compare the magnitude of each of the plurality of peak amplitudes with the reference value.

The processor may be configured to determine that the electric machine is uniformly demagnetised if all of the peak amplitudes are below the reference value. The processor may further determine that the electric machine is partially demagnetised if only some of the peak amplitudes are below the reference value.

The processor may be configured to determine the difference between one or more of the plurality of peak amplitudes corresponding to the one or adjacent pair of permanent magnets and the reference value. If the one or more peak amplitudes is below the reference value, the processor may determine that the one or adjacent pair of permanent magnets is demagnetised and determine the severity of the demagnetisation based on the difference.

The sensor may have an axis of measurement oriented radially towards or away from the axis of rotation. Each peak amplitude may correspond to one of the permanent magnets. The values of magnetic flux density corresponding to each of the peak amplitudes may be measured when the axis of measurement is aligned with the permanent magnet corresponding to the peak amplitude.

The sensor may have an axis of measurement oriented in a tangential direction with respect to the axis of rotation. Each peak amplitude may correspond to an adjacent pair of the permanent magnets. The values of magnetic flux density corresponding to each of the peak amplitudes may be measured when the sensor is equally circumferentially spaced from the pair of permanent magnets corresponding to the peak amplitude.

A trigger signal may cause the sensor to measure the value of magnetic flux density every 90 or 180 electrical degrees.

The magnitude of a peak amplitude in a frequency domain may be compared with the reference value. The peak amplitude may be at a fundamental frequency of the measured values of magnetic flux density.

The magnitude of a peak amplitude in a frequency domain may be compared with the reference value. The processor may be configured to compare the magnitude of a peak amplitude in a frequency domain with the reference value. The processor may be further configured to: determine at least one diagnostic frequency; compare the magnitude of the frequency of the measured value of magnetic flux density at the at least one diagnostic frequency to a second reference value associated with the at least one diagnostic frequency; if the magnitude of the frequency of the measured value of magnetic flux density at the at least one diagnostic frequency is greater than the second reference value, determine that the electric machine is partially demagnetised, and if the magnitude of the frequency of the measured value of magnetic flux density at the at least one diagnostic frequency is less than the second reference value, determine that the electric machine is uniformly demagnetised.

The at least one diagnostic frequency may be determined using the formula $$F_{DEM} = F_e\left(1 \pm \frac{k}{p}\right),$$

k=1, 2, 3 . . . where $F_{DEM}$ is the at least one diagnostic frequency, $F_e$ is the fundamental frequency, p is the number of pole pairs, and k is an integer greater than or equal to 1.

The processor may be configured to determine the difference between the frequency of the measured value of magnetic flux density at the at least one diagnostic frequency and the second reference value. If the electric machine is determined to be partially demagnetised, the severity of the partial demagnetisation may be determined based on the difference.

The measured values of magnetic flux density may be measured in a time domain. The time domain measurements may be converted into the frequency domain using a fast Fourier transform algorithm.

The sensor may have an axis of measurement oriented radially towards or way from the axis of rotation or in a tangential direction with respect to the axis of rotation.

The magnetic flux density measured using the sensor may be leakage flux.

The sensor may be a magnetoresistive sensor.

The electric machine may be an electric motor.

The electric machine may be a permanent magnet synchronous machine (PMSM).

According to another aspect of the disclosure, there is provided a method for diagnosing a fault condition in an electric machine, the electric machine comprising a rotor having an axis of rotation and comprising a plurality of permanent magnets, the method comprising: rotating the rotor so that each of the plurality of permanent magnets passes a magnetic flux density sensor; measuring values of magnetic flux density using the magnetic flux density sensor at a plurality of positions of the rotor; analysing the measured values of magnetic flux density and comparing a magnitude of a peak amplitude in a time or frequency domain with a reference value; and, if the peak amplitude is below the reference value, determining that the electric machine has a fault condition. The method may further comprise determining the difference between the magnitude of the peak amplitude and the reference value. If the electric machine is determined to have a fault condition, the severity of the fault condition may be determined based on the difference.

The fault condition may be demagnetisation.

The magnitude of a peak amplitude in a time domain may be compared with the reference value. The measured values of magnetic flux density may define a plurality of peak amplitudes, each peak amplitude corresponding to one or an adjacent pair of the permanent magnets. The method may further comprise comparing the magnitude of each of the plurality of peak amplitudes with the reference value.

The method may further comprise determining that the electric machine is uniformly demagnetised if all of the peak amplitudes are below the reference value. The method may further comprise determining that the electric machine is partially demagnetised if only some of the peak amplitudes are below the reference value.

The method may further comprise determining the difference between one or more of the plurality of peak amplitudes corresponding to the one or adjacent pair of permanent magnets and the reference value. If the one or more peak amplitudes is below the reference value, the method may further comprise determining that the one or adjacent pair of permanent magnets is demagnetised and determining the severity of the demagnetisation based on the difference.

The sensor may have an axis of measurement oriented radially towards or away from the axis of rotation. Each peak amplitude may correspond to one of the permanent magnets. The values of magnetic flux density corresponding to each of the peak amplitudes may be measured when the axis of measurement is aligned with the permanent magnet corresponding to the peak amplitude.

The sensor may have an axis of measurement oriented in a tangential direction with respect to the axis of rotation. Each peak amplitude may correspond to an adjacent pair of the permanent magnets. The values of magnetic flux density corresponding to each of the peak amplitudes may be measured when the sensor is equally circumferentially spaced from the pair of permanent magnets corresponding to the peak amplitude.

A trigger signal may cause the sensor to measure the value of magnetic flux density every 90 or 180 electrical degrees.

The magnitude of a peak amplitude in a frequency domain may be compared with the reference value. The peak amplitude may be at a fundamental frequency of the measured values of magnetic flux density.

The magnitude of a peak amplitude in a frequency domain may be compared with the reference value. The method may further comprise: determining at least one diagnostic frequency; comparing the magnitude of the frequency of the measured value of magnetic flux density at the at least one diagnostic frequency to a second reference value associated with the at least one diagnostic frequency; if the magnitude of the frequency of the measured value of magnetic flux density at the at least one diagnostic frequency is greater than the second reference value, determining that the electric machine is partially demagnetised, and if the magnitude of the frequency of the measured value of magnetic flux density at the at least one diagnostic frequency is less than the second reference value, determining that the electric machine is uniformly demagnetised.

The at least one diagnostic frequency may be determined using the formula $$F_{DEM} = F_e\left(1 \pm \frac{k}{p}\right),$$

k=1, 2, 3 . . . where $F_{DEM}$ is the at least one diagnostic frequency, $F_e$ is the fundamental frequency, p is the number of pole pairs, and k is an integer greater than or equal to 1.

The method may further comprise determining the difference between the frequency of the measured value of magnetic flux density at the at least one diagnostic frequency and the second reference value. If the electric machine is determined to be partially demagnetised, the severity of the partial demagnetisation may be determined based on the difference.

The measured values of magnetic flux density may be measured in a time domain. The time domain measurements may be converted into the frequency domain using a fast Fourier transform algorithm.

The sensor may have an axis of measurement oriented radially towards or way from the axis of rotation or in a tangential direction with respect to the axis of rotation.

The magnetic flux density measured using the sensor may be leakage flux.

The sensor may be a magnetoresistive sensor.

The electric machine may be an electric motor.

The electric machine may be a permanent magnet synchronous machine (PMSM).

The skilled person will appreciate that except where mutually exclusive, a feature described in relation to any one of the above aspects may be applied mutatis mutandis to any other aspect. Furthermore except where mutually exclusive any feature described herein may be applied to any aspect and/or combined with any other feature described herein.

Arrangements will now be described, by way of example, with reference to the accompanying drawings, in which.

Figure 1:
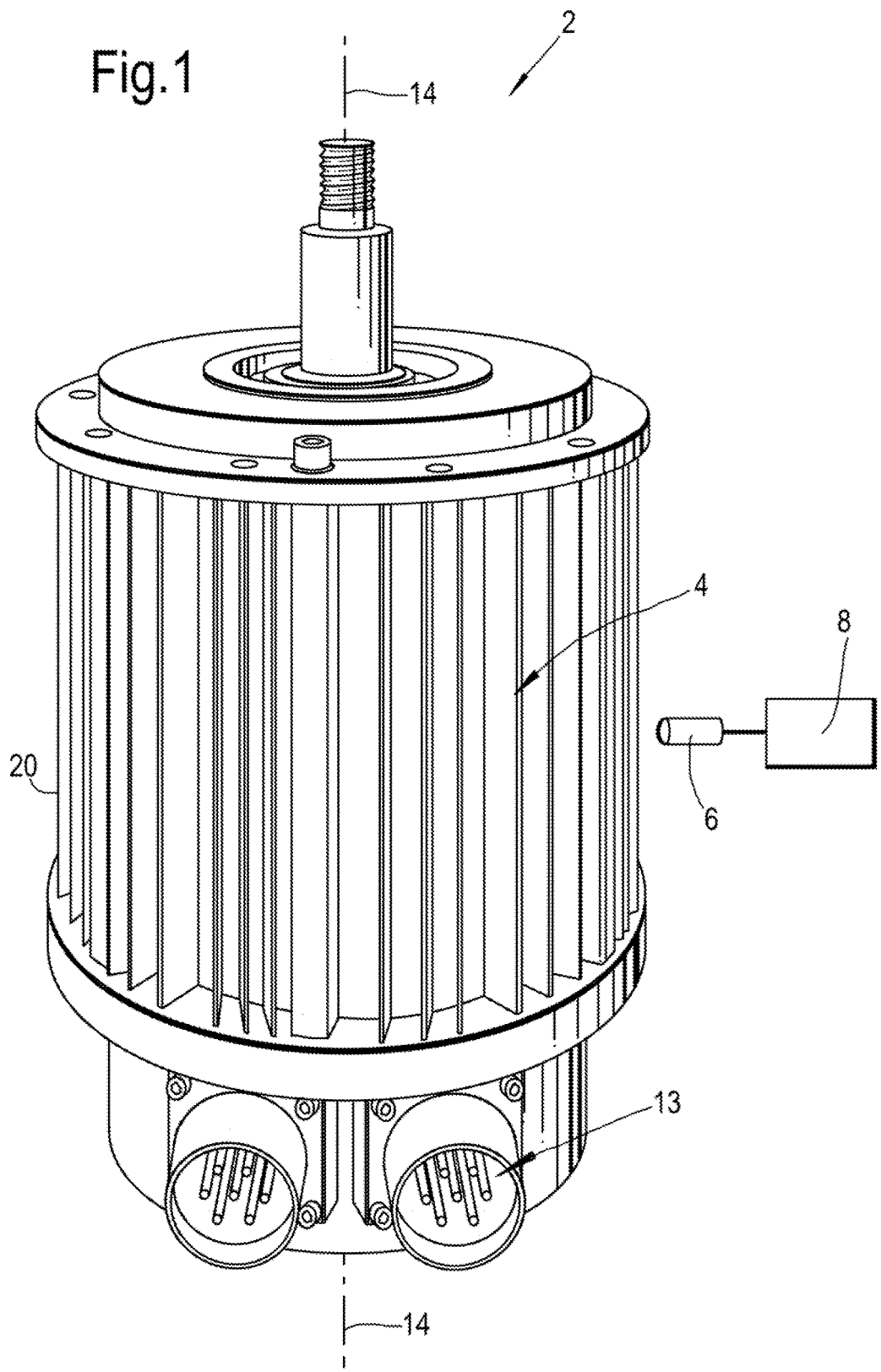
FIG. 1 is a perspective view of an example of a fault diagnosis apparatus used with an electric machine.

FIG. 1 shows a fault diagnosis apparatus 2 for diagnosing a fault condition in an electric machine 4. The fault diagnosis apparatus 2 generally comprises a sensor 6 and a processor 8. The sensor 6 is configured to measure magnetic flux density and output a signal corresponding to the measured magnetic flux density to the processor 8. The processor 8 is configured to analyse data contained within the signal so as to determine whether the electric machine 4 has a fault condition.

The sensor 6 and the processor 8 may be coupled to one another via a wireless link and may consequently comprise transceiver circuitry and one or more antennas. Additionally or alternatively, the sensor 6 and the processor 8 may be coupled to one another via a wired link and may consequently comprise interface circuitry (such as a Universal Serial Bus (USB) socket). It should be appreciated that the sensor 6 and the processor 8 may be coupled to one another via any combination of wired and wireless links.

Figure 4:
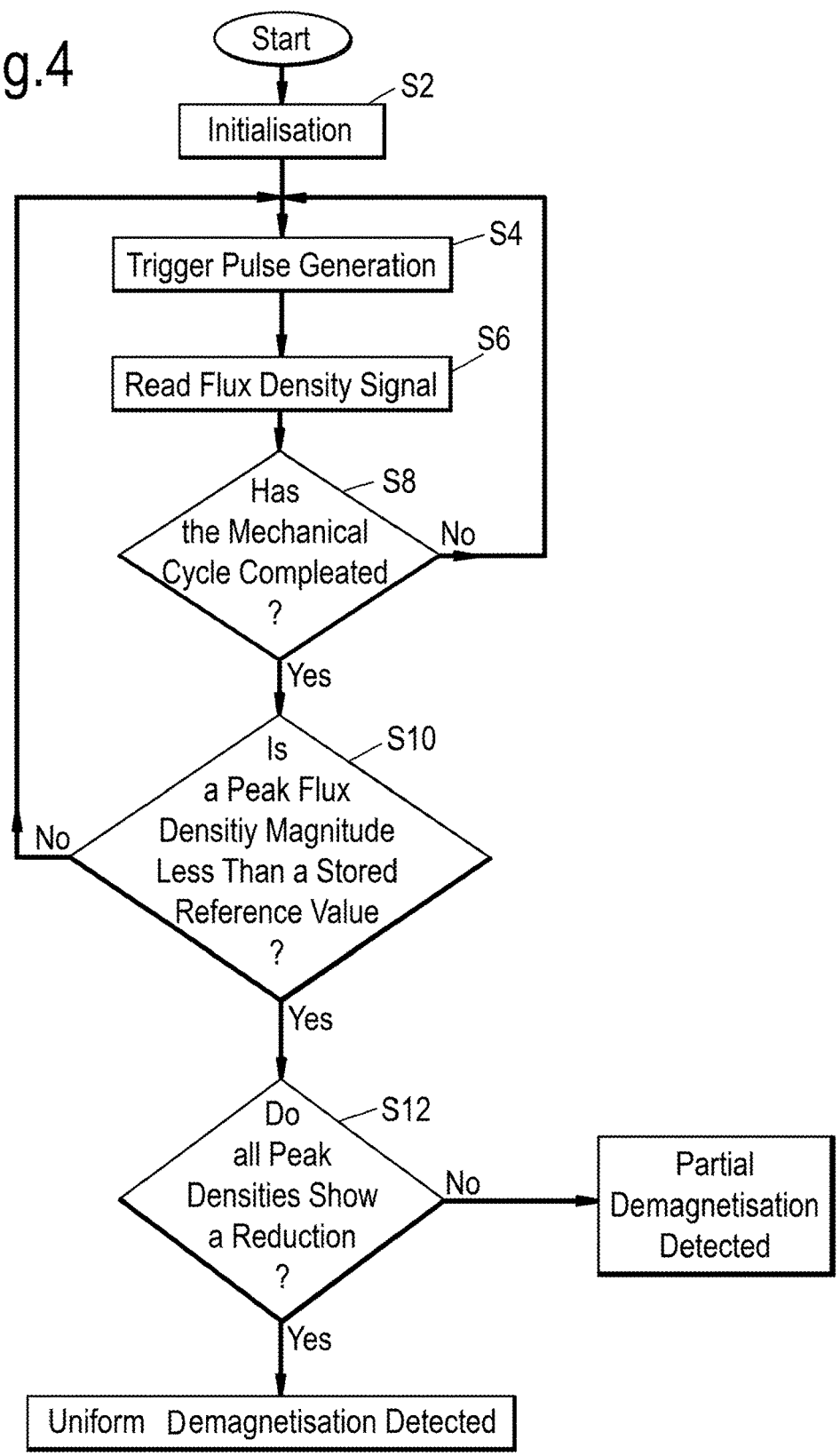
FIG. 4 is a flowchart of a method performed by the fault diagnosis apparatus using the architecture of FIG. 3.
Figure 9:
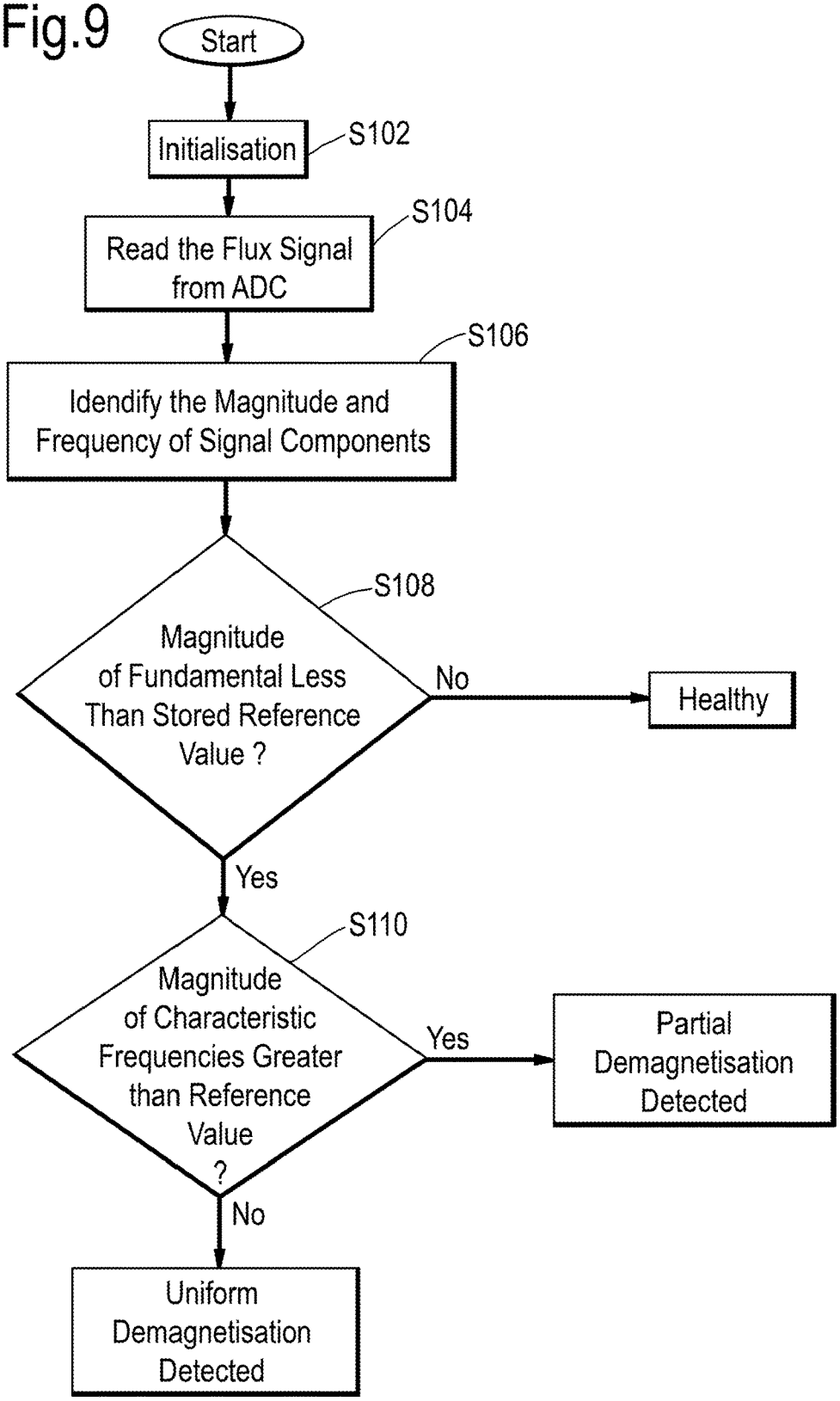
FIG. 9 is a flowchart of a method performed by the fault diagnosis apparatus using the architecture of FIG. 8.

The processor 8 may comprise any suitable circuitry to cause performance of the methods described herein and as illustrated in FIG. 4 or 9. The processor 8 may comprise: control circuitry; and/or processor circuitry; and/or at least one application specific integrated circuit (ASIC); and/or at least one field programmable gate array (FPGA); and/or single or multiprocessor architectures; and/or sequential/parallel architectures; and/or at least one programmable logic controllers (PLCs); and/or at least one microprocessor; and/or at least one microcontroller; and/or a central processing unit (CPU); and/or a graphics processing unit (GPU), to perform the methods illustrated in FIG. 4 or 9.

In various examples, the fault diagnosis apparatus 2 may comprise at least one processor 8 and at least one memory. The memory may store a computer program comprising computer readable instructions that, when read by the processor 8, causes performance of the methods described herein, and as illustrated in FIG. 4 or 9. The computer program may be software or firmware, or may be a combination of software and firmware.

The processor 8 may be located on the electric machine 4, or may be located remote from the electric machine 4, or may be distributed between the electric machine 4 and a location remote from the electric machine 4. The processor 8 may include at least one microprocessor and may comprise a single core processor, may comprise multiple processor cores (such as a dual core processor or a quad core processor), or may comprise a plurality of processors (at least one of which may comprise multiple processor cores).

The memory may be located on the electric machine 4, or may be located remote from the electric machine 4, or may be distributed between the electric machine 4 and a location remote from the electric machine 4. The memory may be any suitable non-transitory computer readable storage medium, data storage device or devices, and may comprise a hard disk and/or solid state memory (such as flash memory). The memory may be permanent non-removable memory, or may be removable memory (such as a universal serial bus (USB) flash drive or a secure digital card). The memory may include: local memory employed during actual execution of the computer program; bulk storage; and cache memories which provide temporary storage of at least some computer readable or computer usable program code to reduce the number of times code may be retrieved from bulk storage during execution of the code.

The computer program may be stored on a non-transitory computer readable storage medium. The computer program may be transferred from the non-transitory computer readable storage medium to the memory. The non-transitory computer readable storage medium may be, for example, a USB flash drive, a secure digital (SD) card, an optical disc (such as a compact disc (CD), a digital versatile disc (DVD) or a Blu-ray disc). In some examples, the computer program may be transferred to the memory via a wireless signal or via a wired signal.

It should be appreciated that the methods illustrated in FIG. 4 or 9 may be performed 'offline' on data which has been measured and recorded previously. Alternatively they may be performed in 'real-time', that is, substantially at the same time that the data is measured.

Figure 2:
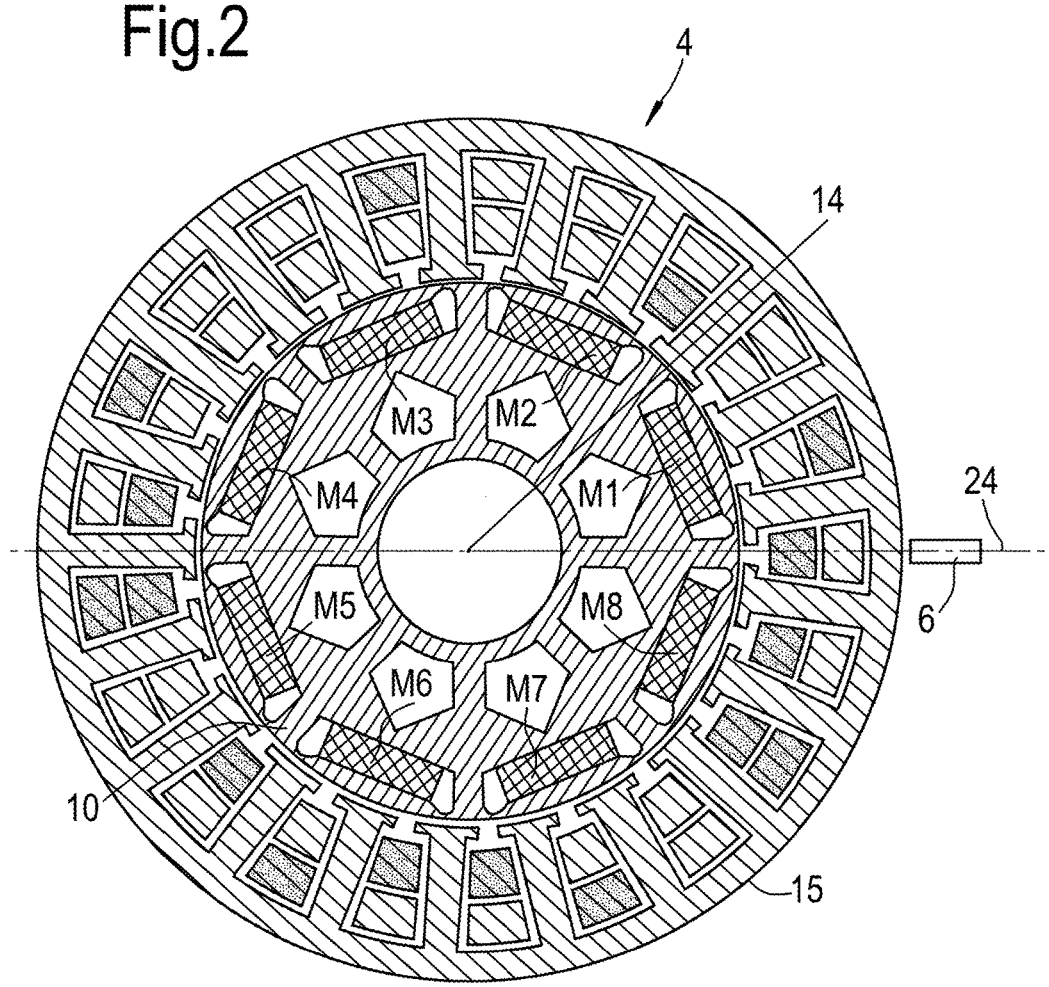
FIG. 2 is a cross-sectional view of the fault diagnosis apparatus and electric machine of FIG. 1.

The electric machine 4 is a permanent magnet synchronous machine (PMSM) and comprises a rotor 10 and a stator 12 (see FIG. 2). AC power is supplied to the electric machine 4 through a socket 13. The rotor 10 and the stator 12 are housed within a housing 20. The rotor 10 is mounted for rotation about an axis of rotation 14. The sensor 6 is positioned externally with respect to the housing 20, such that the rotor 10, stator 12 and housing 20 are disposed between the axis of rotation 14 and the sensor 6. The sensor 6 is held stationary such that the rotor 10 rotates relative to the sensor 6.

FIG. 2 is a cross-sectional view showing the electric machine 4 and sensor 6. The stator 12 of the electric machine 4 generally comprises an annular body 15 and a plurality of electrical coils 18 disposed within the annular body 15. The plurality of electrical coils 18 are spaced equally around the circumference of the annular body 15. The annular body 15 of the stator 12 comprises a central opening within which the rotor 10 is disposed. The rotor 10 comprises a plurality of (eight are shown here) permanent magnets M1-M8 spaced equally around the circumference of the rotor 10. Magnets M1, M3, M5 and M7 define north poles, whereas magnets M2, M4, M6 and M8 define south poles. Accordingly, the magnets M1 to M8 successively alternate between defining north and south poles. That is, each permanent magnet M1-M8 has a polarity which is opposite to that of the adjacent two magnets M1-M8.

The sensor 6 has an axis of measurement 24. The axis of measurement 24 is defined as the axis along which the sensor 6 is able to detect magnetic flux density most sensitively. As shown, the axis of measurement 24 for the sensor 6 is oriented radially such that it intersects the axis of rotation 14 and is perpendicular to the axis of rotation 14.

The electric machine 4 is susceptible to a variety of different fault conditions, such as uniform or partial demagnetisation. Uniform demagnetisation is where the magnetisation of each of the plurality of permanent magnets is reduced by an equal extent (i.e. each of the plurality of permanent magnets are equally demagnetised). This may result from heating, stressing, or applying an external magnetic field to one or more of the permanent magnets, for example. In contrast, with partial demagnetisation, the level of demagnetisation varies between the permanent magnets. In other words, some but not all of the permanent magnets M1-M8 may be demagnetised, or all of the permanent magnets may be demagnetised, but by different extents.

Figure 3:
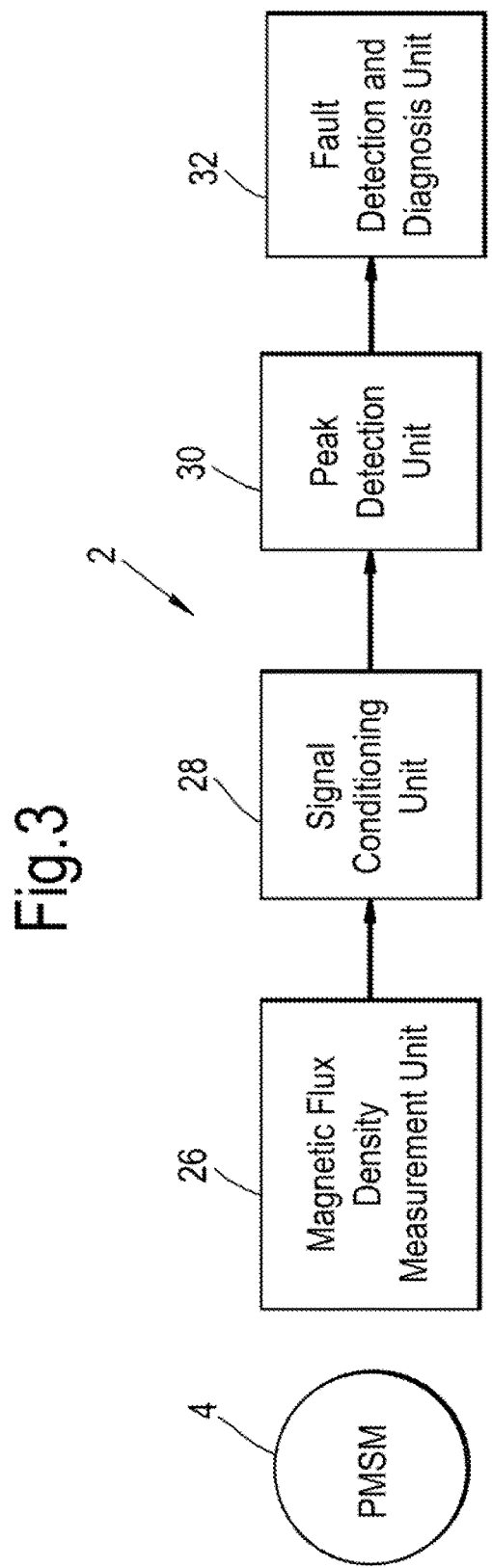
FIG. 3 is a schematic view of a first example of a system architecture used in the fault diagnosis apparatus.

FIG. 3 shows a first example of a system architecture used in the fault diagnosis apparatus 2. As shown, the fault diagnosis apparatus 2 comprises a magnetic flux density measurement unit 26, a signal conditioning unit 28, a peak detection unit 30 and a fault detection and diagnosis unit 32. The fault diagnosis apparatus 2 is configured to diagnose a fault condition based on characteristic differences in the variation of magnetic flux density as the rotor 10 rotates about the axis of rotation 14.

For example, the differences may indicate the presence or absence of demagnetisation, in particular uniform or partial demagnetisation.

The signal conditioning unit 28, peak detection unit 30 and fault detection and diagnosis unit 32 form part of the processor 8. The sensor 6 forms part of the magnetic flux density measurement unit 26, and outputs an analogue signal to the signal conditioning unit 28 that is representative of the magnetic flux density at the position of the sensor 6. The sensor 6 is a magnetoresisitive sensor capable of measuring very small levels of magnetic flux density in the range of a few gauss. Consequently, the sensor 6 outputs a low power signal.

The signal conditioning unit 28 comprises a signal amplifier and an analogue-to-digital converter (ADC), arranged in series. The signal amplifier of the signal conditioning unit 28 receives the low power analogue signal produced by the sensor 6, amplifies it, and outputs it to the ADC. The ADC then converts the amplified analogue signal into a digital signal.

The peak detection unit 30 and the fault detection and diagnosis unit 32 are described with reference to FIG. 4, which shows a flow diagram of a method performed by the fault diagnosis apparatus 2 using the first architecture.

At step S2, the fault diagnosis apparatus 2 performs an initialisation routine in which values are assigned to a number of variables, such as timer variables, trigger variables, the number of poles (i.e. the number of permanent magnets), the starting position of the rotor and reference values. Following initialisation, the electric machine 4 is switched on. Specifically, alternating current is supplied to the plurality of electrical coils 18, such that the stator 12 generates a rotating magnetic field. The rotating magnetic field rotates about the axis of rotation 14. Due to the effects of magnetic attraction and repulsion, the permanent magnets M1-M8 and thus the rotor 10 rotate synchronously with the rotating magnetic field about the axis of rotation 14.

Accordingly, the electric machine 4 acts as an electric motor. As the permanent magnets M1-M8 of the rotor 10 move sequentially past the sensor 6, the sensor 6 measures an associated variation in magnetic flux density.

By knowing the position of the plurality of electrical coils 18 (i.e. the winding arrangement) and the position of the permanent magnets M1-M8, it is possible to determine the optimal position at which to locate the sensor 6. In the electric machine 4, the electrical coils 18 are positioned at the ends of the electric machine 4. Accordingly, as shown in FIG. 1, in this example, the sensor 6 is positioned partway along the axial length of the housing 20 (and thus the electric machine 4). Specifically, the sensor 6 is positioned in the middle of the housing 20 so that it is spaced an equal distance from the two axial ends of the housing 20 (and thus the electrical coils 18). Consequently, the sensor 6 measures a high proportion of magnetic flux originating from the permanent magnets M1-M8, rather than from the electrical coils 18.

Figure 5:
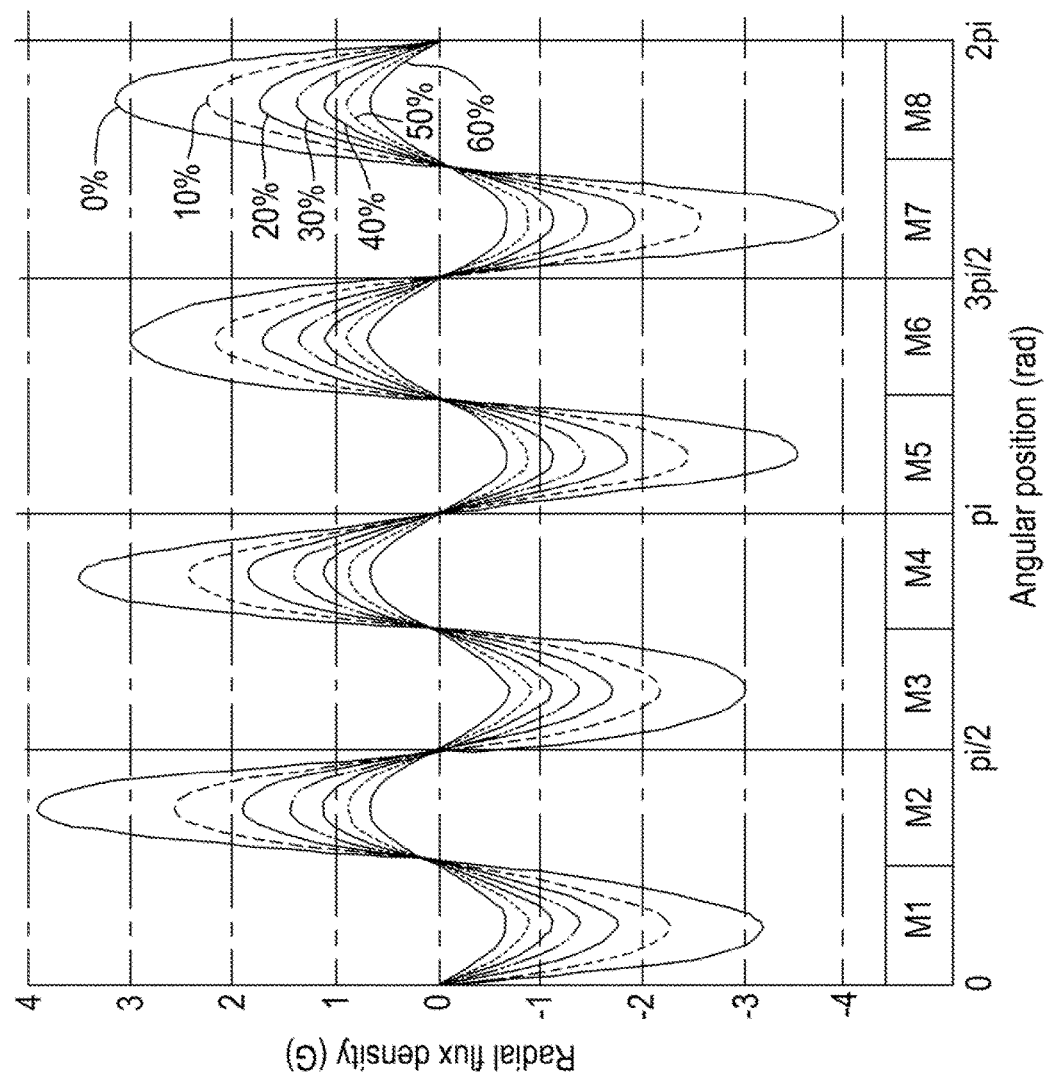
FIG. 5 is a graph of magnetic flux density against angular position for a rotor having different uniform demagnetisation conditions.

FIG. 5 demonstrates the variation of magnetic flux density measured by the sensor 6 as the rotor 10 rotates about the axis of rotation 14 over a complete revolution of the rotor 10. As the sensor 6 is positioned externally with respect to the housing 20 and the electric machine 4 as a whole, the magnetic flux measured by the sensor 6 is leakage flux. Leakage flux is flux located outside of the path along which it can do useful work, and therefore does not help to drive the rotor 10. Consequently, due to its position, the sensor 6 does not affect the operation of the electric machine 4.

The variation of magnetic flux density is shown for a variety of different uniform demagnetisation conditions. Specifically, the variation of magnetic flux density is shown for a 0% uniform demagnetisation condition in which each of the plurality of magnets M1-M8 are completely magnetised, and 10%, 20%, 30%, 40%, 50% and 60% uniform demagnetisation conditions in which each of the plurality of magnets M1-M8 are equally demagnetised by 10%, 20%, 30%, 40%, 50% and 60%, respectively.

The variation of magnetic flux density measured by the sensor 6 as the 0% demagnetised rotor 10 rotates over a complete revolution about the axis of rotation 14 will now be described.

In FIG. 2, the rotor 10 is shown in an angular position of 0 radians. In this position, the sensor 6, and thus its axis of measurement 24, is spaced an equal distance from permanent magnet M8 defining a south pole and permanent magnet M1 defining a north pole and so the magnetic flux density measured by the sensor 6 is zero. As the rotor 10 rotates in a clockwise direction, the magnetic flux density increases negatively. Once the rotor 10 has rotated $\pi/8$ radians (90 electrical degrees), the sensor 6 is directly aligned with the permanent magnet M1 which defines a north pole. In this position, the magnetic flux density measured by the sensor 6 is at a maximum negative value (i.e. a trough). As the rotor 10 continues to move in a clockwise direction, the magnetic flux density decreases such that it returns towards 0. Specifically, once the rotor 10 has rotated a total of $\pi/4$ radians (180 electrical degrees), the sensor 6 is again spaced an equal distance from permanent magnet M1 defining a north pole and permanent magnet M2 defining a south pole, and, accordingly, the magnetic flux density measured by the sensor 6 is again zero. As the rotor 10 continues to move in a clockwise direction, the magnetic flux density increases positively. Once the rotor has rotated a total of $3\pi/8$ radians (270 electrical degrees), the sensor 6 and thus its axis of measurement 24 are directly aligned with permanent magnet M2 defining a south pole. Accordingly, the magnetic flux density measured by the sensor 6 increases to a maximum positive value (i.e. a peak). Following this peak, the magnetic flux density again decreases until the rotor has rotated a total of $\pi/2$ radians (360 electrical degrees), at which point the magnetic flux density measured by the sensor 6 is again zero.

The magnetic flux measured by the sensor 6 as the rotor 10 rotates therefore has a sinusoidal form having a wavelength of $\pi/2$ radians. In particular, the rotor 10 rotates over a complete revolution (i.e. $2\pi$ radians) and the sensor 6 is brought into alignment with each of the permanent magnets M1-M8 in succession, and so the sinusoidal form of the magnetic flux density has a total of four peaks and four troughs, with each peak and trough corresponding to a separate permanent magnet M1-M8.

The various uniform demagnetisation conditions shown in FIG. 5 all exhibit the same generally sinusoidal form owing to the movement of the magnets M1-M8 past the sensor 6. However, as a result of the demagnetisation, the magnitude of the measured magnetic flux density is reduced at all angular positions and thus the amplitude of the sinusoidal form is reduced. The extent of the reduction in amplitude correlates to the extent of demagnetisation, such that a greater level of demagnetisation results in a lower amplitude waveform.

Figure 6:
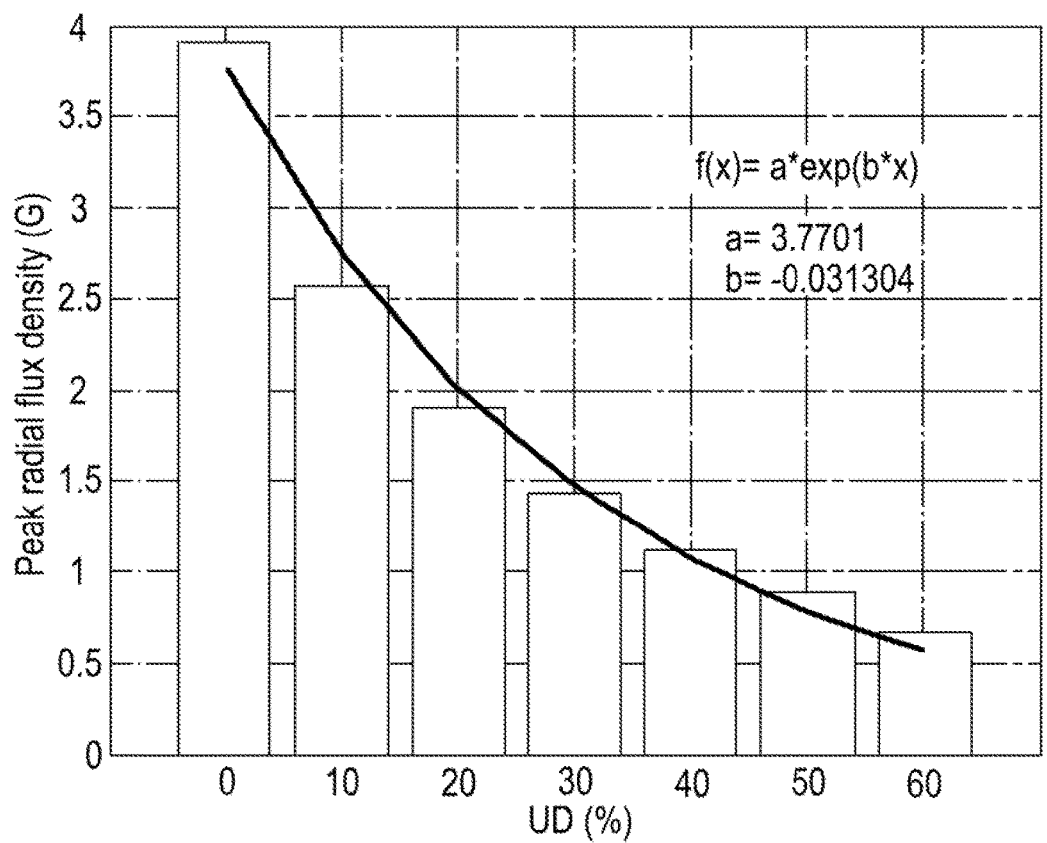
FIG. 6 is a graph of peak magnetic flux density against demagnetisation.

This effect is demonstrated by FIG. 6, which shows the relationship between the level of uniform demagnetisation and the maximum absolute magnetic flux density measured by the sensor 6. As shown, the relationship between the level of uniform demagnetisation and the maximum absolute magnetic flux density follows an exponential function of the form $f(x)=a.\exp^{(b.x)}$, where f is the maximum absolute magnetic flux density, x is the level of uniform demagnetisation, and a and b are constants. The constants a and b can be derived empirically and have been found to be 3.7701 and −0.031304 respectively in this example. The level of demagnetisation can thus be derived from a maximum absolute magnetic flux density value.

Figure 7:
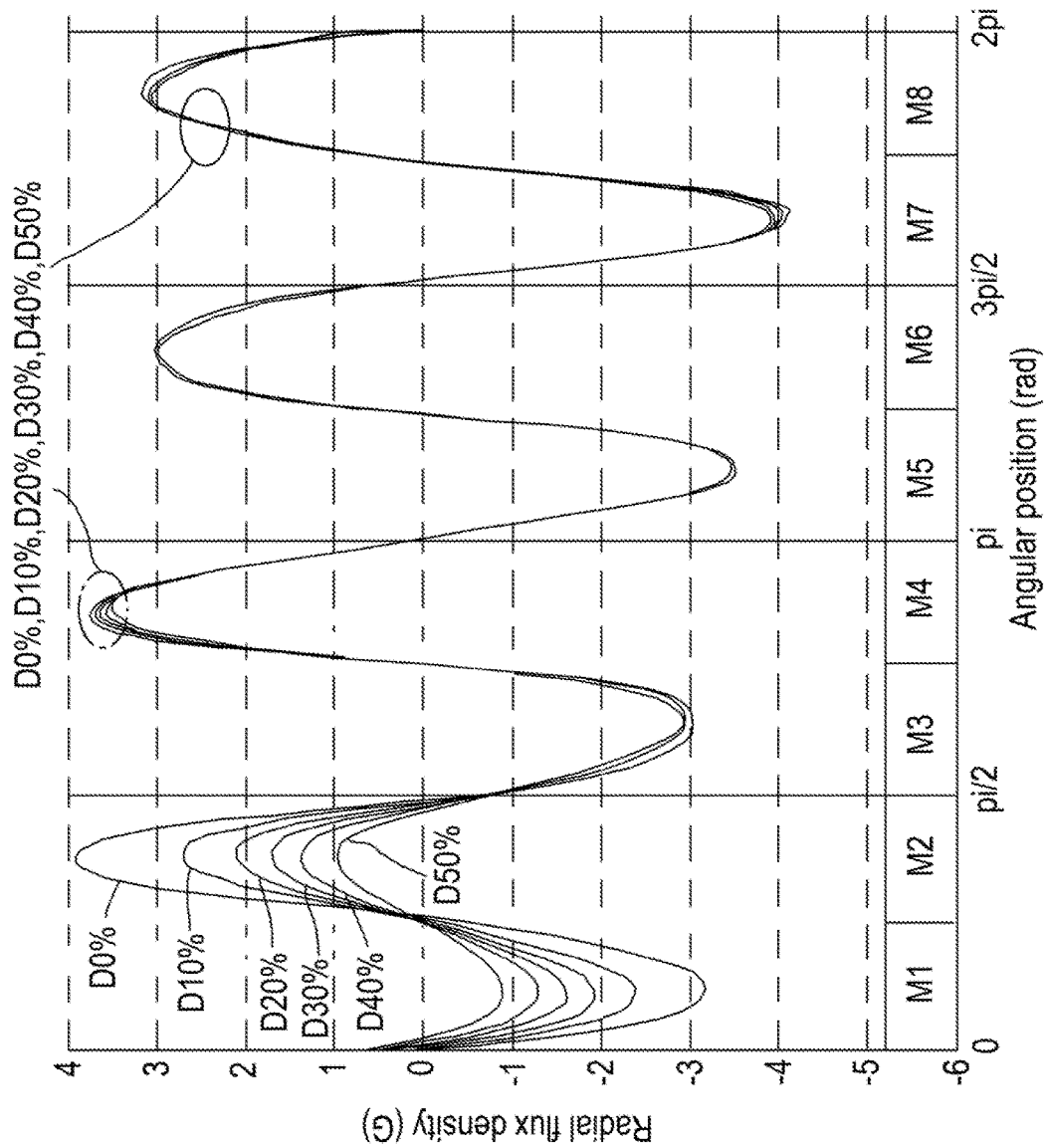
FIG. 7 is a graph of magnetic flux density against angular position for a rotor having different partial demagnetisation conditions.

As per FIG. 5, FIG. 7 shows the variation of magnetic flux density measured by the sensor 6 as the rotor 10 rotates through a complete revolution. In contrast to FIG. 5, FIG. 7 shows the variation of magnetic flux density for a variety of different partial demagnetisation conditions. Specifically, FIG. 7 shows the variation of magnetic flux density when the first and second magnets M1, M2 are demagnetised by 10%, 20%, 30%, 40% and 50%, with the other magnets M3-M8 remaining completely magnetised.

The peaks and troughs corresponding to the third to eighth magnets M3-M8 substantially correspond to the corresponding peaks and troughs of FIG. 5 for the non-demagnetised condition. In contrast, the trough and peak corresponding to the first magnet M1 and the second magnet M2 vary in magnitude, based on the extent of partial demagnetisation. The relationship between the extent of partial demagnetisation of the first and second magnets M1, M2 and the peak magnetic flux density is similar to that shown under the uniform demagnetisation condition. Specifically, as the magnitude of partial demagnetisation increases, the extent of the reduction in the peaks and troughs corresponding to the demagnetised magnets M1, M2 increases.

Returning to FIG. 4, step 64 comprises generating a trigger pulse when the sensor 6 is directly aligned with each of the permanent magnets M1-M8 corresponding to each peak and trough in the measured magnetic flux density. In order to achieve this, a trigger pulse must be generated every 180 electrical degrees of rotation over at least one complete revolution. In some arrangements, a trigger pulse may be generated every 90 electrical degrees. Variables assigned in the initialisation step 62 are used to determine the mechanical angles of the rotor 10 at which the measurements should be taken, and thus the mechanical angles at which the trigger pulses should be generated. For example, the mechanical angles at which the trigger pulses should be generated can be determined based on the starting position of the rotor and the number of permanent magnets. In the eight-pole machine described previously, a trigger pulse is generated at 0, 46, 00, 136, 180, 225, 270, 315 and 360 (corresponding to 0) mechanical degrees. In order to determine when the trigger pulse should be generated, the position of the rotor 10 is measured using a position sensor. Such position sensors are typically provided in PMSMs.

Step S6 comprises reading the value of magnetic flux density produced by the signal conditioning unit 28, specifically produced by the ADC, when the trigger pulse is generated. As the rotor 10 rotates, a value of magnetic flux density produced by the signal conditioning unit 28 is read each time a trigger pulse is generated. The values of magnetic flux density read from the signal conditioning unit 28 are stored for subsequent analysis by the fault detection and diagnosis unit 32.

After each value of magnetic flux density is collected, a determination is made at step S8 as to whether a full revolution has been completed. If a complete revolution has not been completed, steps S4 and S6 are repeated such that a value of magnetic flux density produced by the signal conditioning unit 28 continues to be read each time a trigger pulse is generated. Once a complete revolution has been completed, the stored values of magnetic flux density are analysed by the fault detection and diagnosis unit 32 so as to determine whether the electric machine 4 has a fault condition.

In step S10, the fault detection and diagnosis unit 32 looks up a stored reference value. The reference value may be stored in a lookup table. Each of the values of magnetic flux density read by the peak detection unit 30 are compared to the stored reference value. If all of the absolute values of the stored values of magnetic flux density are greater than the reference value, the electric machine 4 is determined not to have a fault condition, such as demagnetisation. Where a fault is not initially detected, steps S4 to S10 may be repeated to periodically check for a fault condition. If the absolute value of any of the stored values magnetic flux density are less than the reference value, the electric machine 4 is determined to have a fault condition, in particular a demagnetisation fault condition.

Where a fault is detected at S10, the fault detection and diagnosis unit 32 determines at S12 whether all of the absolute values of the stored values of magnetic flux density are less than the reference value. If so, the electric machine 4 is determined to be uniformly demagnetised. If not, the electric machine 4 is determined to be partially demagnetised.

As is clear from FIGS. 5 to 7, the magnitude of the reference value can be changed in order to adjust the sensitivity of the fault detection and diagnosis unit 32. Using the data shown in FIG. 5 as an example, if the threshold is set at 2.75 gauss for example, an electric machine 4 having a uniform demagnetisation of 10% would be determined to be demagnetised. Conversely, if the threshold were to be set at 2 gauss, an electric machine 4 having a uniform demagnetisation of 10% would not be determined to be demagnetised, whereas an electric machine 4 having a uniform demagnetisation of 20% would be determined to be demagnetised.

If a demagnetisation fault condition has been identified, the magnitude of the reference value also affects whether the fault condition is determined to be a uniform demagnetisation fault condition or a partial demagnetisation fault condition. Again using the data shown in FIG. 5 as an example, if the threshold were set at 2.75 gauss, an electric machine 4 having a uniform demagnetisation of 10% would be determined to be uniformly demagnetised. However, if the threshold were set at 2.25 gauss, an electric machine 4 having a uniform demagnetisation of 10% would be determined to be partially demagnetised.

The fault detection and diagnosis unit 32 can also be used to determine the severity of demagnetisation for both uniform and partial demagnetisation conditions. Specifically, if the absolute value of a single one of the stored values of magnetic flux density corresponding to one of the plurality of permanent magnets M1-M8 is less than the reference value, the fault detection and diagnosis unit 32 determines the difference between the absolute value of the measured value and the reference value. If the difference is large, the permanent magnet M1-M8 to which the measured value corresponds is determined to have a high level of demagnetisation, whereas if the difference is small, the permanent magnet M1-M8 to which the measured value corresponds is determined to have a low level of demagnetisation. The extent of demagnetisation of an individual permanent magnet M1-M8 can be determined based on the level of magnetic flux density using the exponential function described previously. Likewise, the same process can be carried out if a plurality or all of the measured values of magnetic flux density are less than the reference value. In such circumstances, the individual severity of demagnetisation of each of the plurality of permanent magnets M1-M8 can be totaled or averaged in order to determine the overall severity of uniform or partial demagnetisation of the entire electric machine 4.

Figure 8:
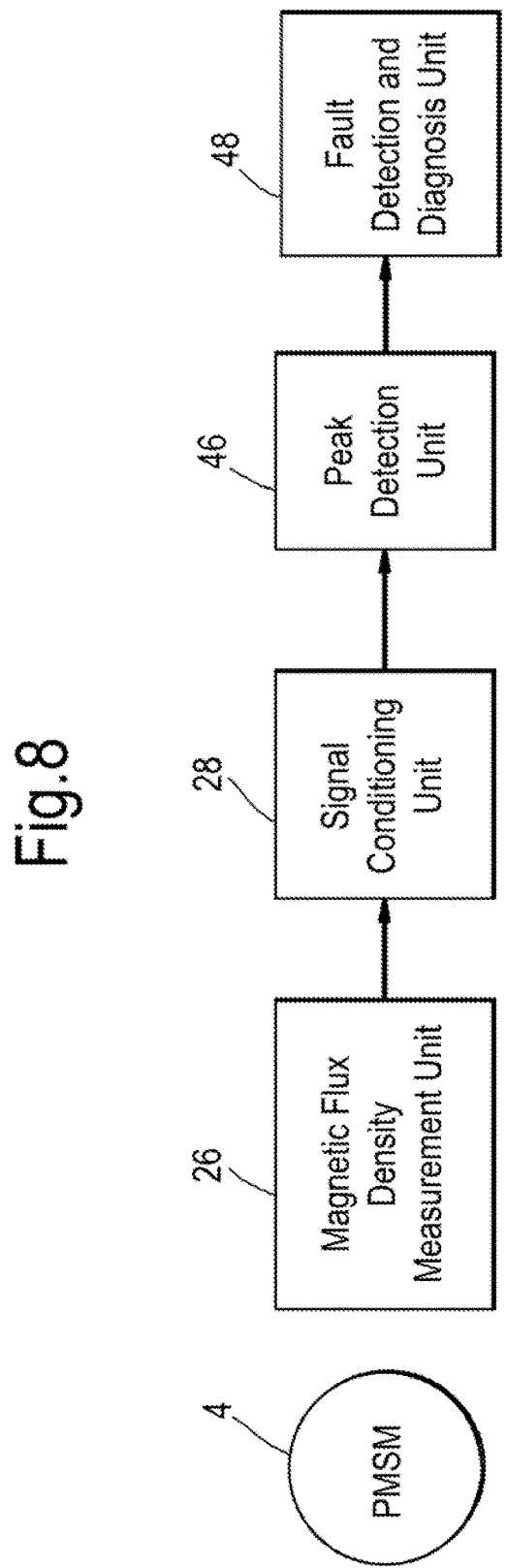
FIG. 8 is a schematic view of a second example of a system architecture used by the fault diagnosis apparatus.

FIG. 8 shows a second example of a system architecture used in the fault diagnosis apparatus 2. As shown, the fault diagnosis apparatus 2 comprises a magnetic flux density measurement unit 26, a signal conditioning unit 28, a frequency detection unit 46 and a fault detection and diagnosis unit 48. The magnetic flux density measurement unit 26 and the signal conditioning unit 28 substantially correspond to those provided in the first architecture described above.

The frequency detection unit 46 and the fault detection and diagnosis unit 48 are described with reference to FIG. 9, which shows a flow diagram of a method performed by the fault diagnosis apparatus 2 using the second architecture.

Step S102 is an initialisation step substantially corresponding to step S2 of the method of FIG. 4. However, step S102 of this method further comprises the step of calculating a plurality of characteristic frequencies. The plurality of characteristic frequencies are calculated using the formula $$F_{DEM} = F_e \left(1 \pm \frac{k}{p}\right),$$

k=1, 2, 3 . . . where $F_{DEM}$ is the at least one characteristic frequency, $F_e$ is the fundamental frequency, p is the number of pole pairs, and k is an integer greater than or equal to 1. The fundamental frequency is determined based on the speed of the electric machine 4 and the number of permanent magnets M1-M8.

As with the method of FIG. 4, following initialisation, the electric machine 4 is activated such that the rotor 10 rotates about the axis of rotation 14. Accordingly, the permanent magnets M1-M8 of the rotor 10 move sequentially past the sensor 6.

Step S104 comprises continually reading the value of magnetic flux density produced by the signal conditioning unit 28 over the entirety of at least one revolution of the rotor 10. The processor 8 records the time at which each measurement of magnetic flux density is taken. Accordingly, the variation of magnetic flux density with respect to time is determined. The values of magnetic flux density are read at a rate high enough for subsequent harmonic analysis to take place.

Step S106 comprises converting the variation of magnetic flux density with respect to time from the time domain into the frequency domain using a fast Fourier transform algorithm. In this manner, a frequency spectrum of the variation of magnetic flux density with respect to frequency is determined.

Figure 10:
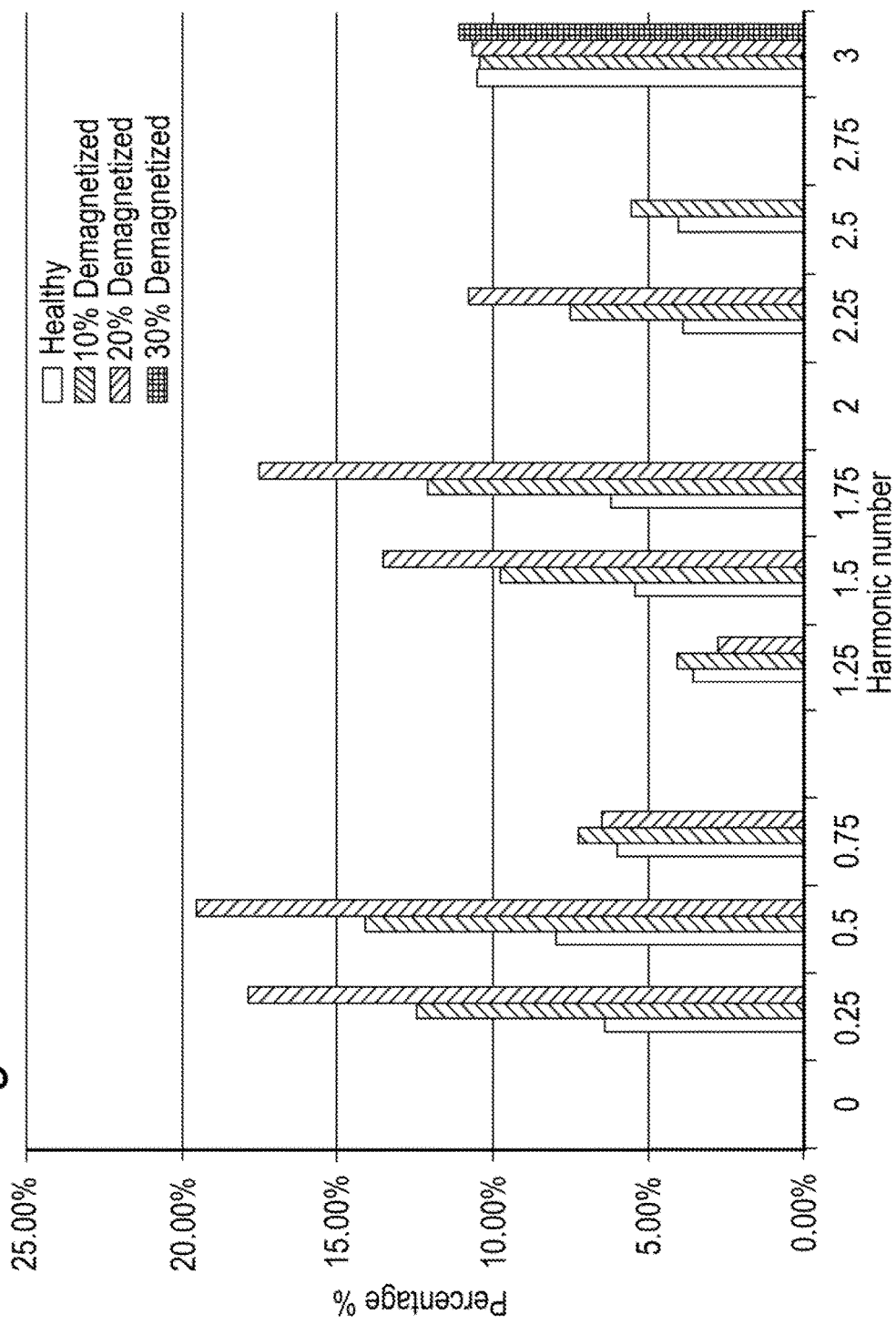
FIG. 10 is a graphical representation of the values of a calculated frequency spectrum at a plurality of characteristic frequencies for a number of different partial demagnetisation fault conditions.

FIG. 10 shows a number of fault characteristics used to diagnose a fault condition using the method of FIG. 9. FIG. 10 shows a clustered column bar chart showing data calculated using the fast Fourier transform algorithm. The data shown is for a 9-slot electric machine with an exterior rotor having four pole pairs (i.e. eight poles or permanent magnets). The bar chart illustrates the value of the frequency spectrum at a number of characteristic frequencies for a healthy electric machine, a 10% partially demagnetized electric machine, a 20% partially demagnetised electric machine and a 30% partially demagnetized electric machine. The characteristic frequencies are labelled according to their "harmonic number", with the fundamental frequency (although not shown) having a harmonic number of 1. As such, a characteristic frequency having a harmonic number of 1.5, for example, is 1.5 times larger than the fundamental frequency.

The fast Fourier transform algorithm determines the power spectral density of the variation of magnetic flux density. Accordingly, the fast Fourier transform algorithm is able to determine the power, or power per frequency, of the variation of magnetic flux density across a range of frequencies. FIG. 10 shows the value of the frequency spectrums at each characteristic frequency for each electric machine, expressed as a percentage of the value of the frequency spectrum at the fundamental frequency of each respective electric machine. Accordingly, the values of the frequency spectrums at each characteristic frequency are normalised with respect to the values of the frequency spectrums at the fundamental frequency. Consequently, although not shown, the value for each electric machine at harmonic number 1 is 100%. Although not shown (due to normalisation of the data), as the level of both partial and uniform demagnetisation increases (i.e. as the level of any type of demagnetisation increases), the value of the frequency spectrum at the fundamental frequency decreases. Further, as clearly demonstrated by FIG. 10, as partial demagnetisation increases, the value of the frequency spectrum at most (but not necessarily all) of the characteristic frequencies increases. It is the values of the frequency spectrum at these characteristic frequencies that are subsequently used in step S110 to determine the presence or absence of partial demagnetisation. These characteristic frequencies are identified by carrying out a finite element method (FEM) or finite element analysis (FEA) on a model of the electric machine 4.

Step S106 comprises reading the value of the frequency spectrum at the fundamental frequency, reading the value of the frequency spectrum at one of the characteristic frequencies identified using FEM or FEA, and outputting both values to the fault detection and diagnosis unit 48.

In step S108, the fault detection and diagnosis unit 48 looks up a first reference value, and compares it to the value of the frequency spectrum at the fundamental frequency. If the value of the frequency spectrum at the fundamental frequency is greater than the first reference value, the electric machine 4 is determined to be healthy, and not to be demagnetised. If the value of the frequency spectrum at the fundamental frequency is less than the first reference value, the electric machine 4 is determined to have a fault condition, in particular a demagnetisation fault condition.

Where a fault is detected at S108, the fault detection and diagnosis unit 48 looks up a second reference value at S110, and compares it to the value of the frequency spectrum at the characteristic frequency. If the value of the frequency spectrum at the characteristic frequency is greater than the value of the second reference value, the electric machine 4 is determined to be partially demagnetised. If not, the electric machine 4 is determined to be uniformly demagnetised.

As per the fault detection and diagnosis unit 32 used in the method of FIG. 4, the fault detection and diagnosis unit 48 used in this method can be used to determine the severity of demagnetisation for both uniform and partial demagnetisation conditions. Specifically, if the value of the frequency spectrum at the fundamental frequency is less than the first reference value, the fault detection and diagnosis unit 48 determines the difference between the value of the frequency spectrum at the fundamental frequency and the first reference value. If the difference is large, the electric machine 4 is determined to have a high level of demagnetisation. If the difference is small, the electric machine 4 is determined to have a low level of demagnetisation. Likewise, if the value of the frequency spectrum at the characteristic frequency is greater than the second reference value, the fault detection and diagnosis unit 48 determines the difference between the value of the frequency spectrum at the characteristic frequency and the second reference value. If the difference is large, the electric machine 4 is determined to have a high level of partial demagnetisation. If the difference is small, the electric machine 4 is determined to have a low level of partial demagnetisation. Further, if the value of the frequency spectrum at the characteristic frequency is less than the second reference value, the fault detection and diagnosis unit 48 determines the difference between the value of the frequency spectrum at the characteristic frequency and the second reference value. If the difference is large, the electric machine 4 is determined to have a high level of uniform demagnetisation. If the difference is small, the electric machine 4 is determined to have a low level of uniform demagnetisation.

Figure 11:
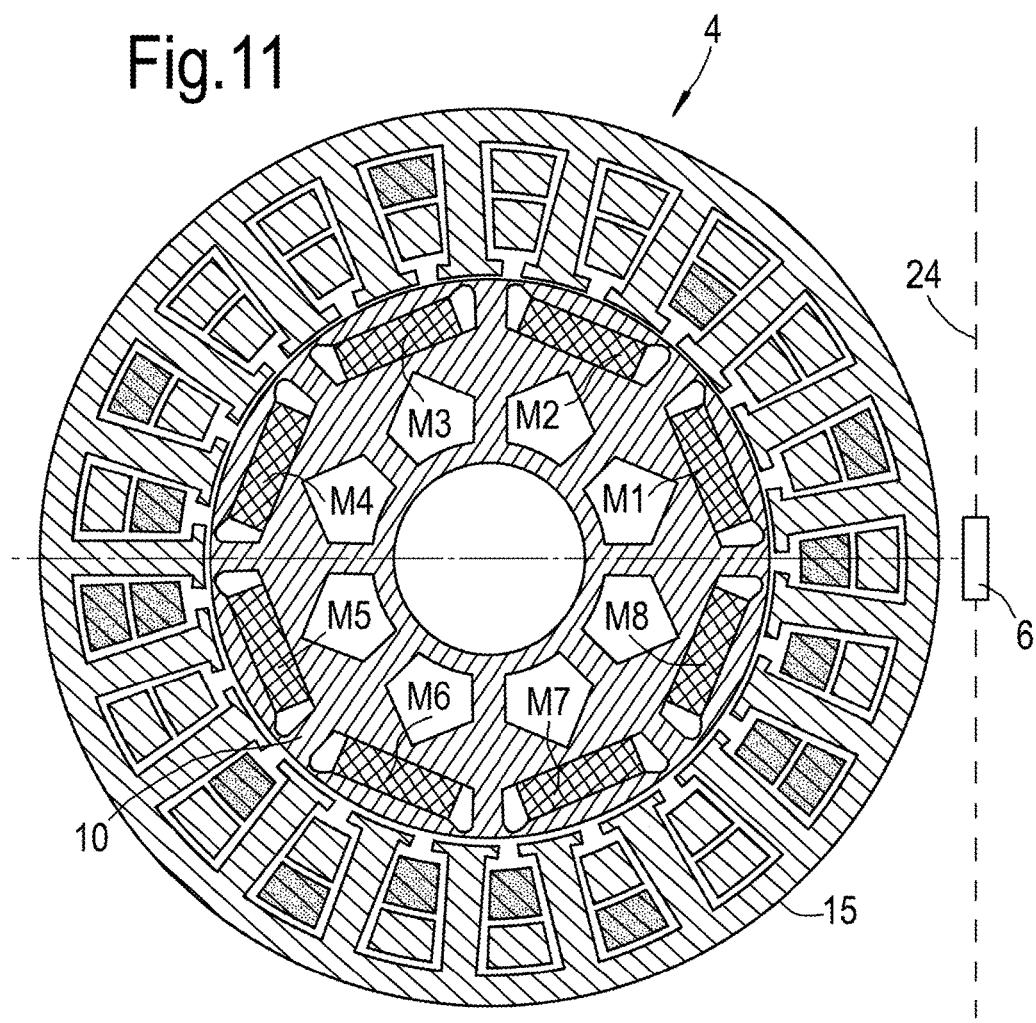
FIG. 11 is a cross-sectional view of another example of a fault diagnosis apparatus.

FIG. 11 is a cross-sectional view showing an alternative arrangement of the electric machine 4 and sensor 6 of FIG. 2. In the alternative arrangement, the sensor 6 is arranged such that its axis of measurement 24 is oriented tangentially with respect to the axis of rotation 14. Accordingly, the axis of measurement 24 is not oriented radially towards the axis of rotation 14, but lies along the intersection of a plane that is parallel to the axis of rotation 14 and a plane that is perpendicular to the axis of rotation 14.

Due to the difference in orientation of the sensor 6 and its associated axis of measurement 24, the sensor 6 measures maximum and minimum values (i.e. most positive and most negative values) of magnetic flux density when the sensor 6, and thus its axis of measurement 24, are spaced an equal distance from adjacent permanent magnets M1-M8. Accordingly, each peak or trough in the sinusoidal form of the magnetic flux measured by the sensor 6 is associated with a pair of adjacent permanent magnets, rather than a single permanent magnet. Therefore, in the method of FIG. 4, if a peak or trough is identified as having an absolute value less than the reference value, one or both of the pair of corresponding adjacent permanent magnets are determined to be demagnetised. Similarly, if an adjacent peak and trough are identified as having an absolute value less than the reference value, the corresponding permanent magnet associated with both the peak and the trough is determined to be demagnetised.

Figure 12:
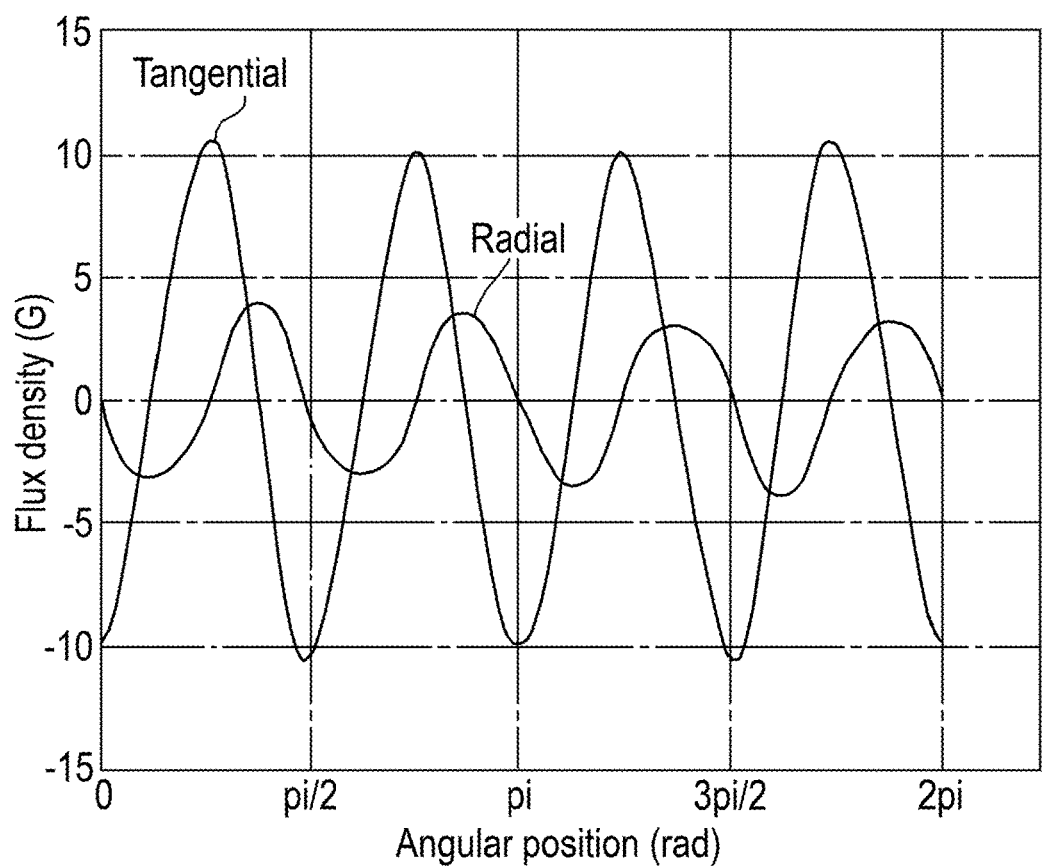
FIG. 12 is a graph of magnetic flux density against angular position for the fault diagnosis apparatus of FIG. 2 and FIG. 11.

As shown in FIG. 12, the magnetic flux density measured by the tangentially arranged sensor 6 of FIG. 11 is offset by 90 electrical degrees with respect to the magnetic flux density measured by the radially arranged sensor 6 of FIG. 2. Accordingly, in the method of FIG. 4, the trigger signals for an arrangement having a tangentially arranged sensor 6 must be offset by 90 electrical degrees from corresponding measurements taken using a radially arranged sensor 6.

With reference to the method of FIG. 9, it has been described that partial and uniform demagnetisation can be differentiated using the value of the frequency spectrum at a single characterising frequency. However, in some arrangements, the value of the frequency spectrum at multiple characteristic frequencies can be used to differentiate between partial demagnetisation and uniform demagnetisation. For example, the method may further comprise reading the value of the frequency spectrum at multiple characteristic frequencies, averaging the values, and comparing the average value to the second reference value in order to determine whether or not the electric machine 4 is uniformly demagnetised or partially demagnetised.

It has also been described that the characterising frequencies that are expected to show a characteristic increase in value when the electric machine 4 is partially demagnetised are identified using FEM or FEA. In some arrangements, the characteristic frequency or characteristic frequencies at which the value of the frequency spectrum is expected to show the greatest (i.e. the most significant or pronounced) increase in value upon the electric machine 4 becoming partially demagnetised are identified using FEM or FEA. Such characteristic frequencies may be referred to as dominant harmonics or dominant characteristic frequencies. The value of the frequency spectrum at these dominant characteristic frequencies may then be used in step S110 to differentiate between partial demagnetisation and uniform demagnetisation.

In some arrangements, the magnetic flux density measurement unit 26 comprises a temperature sensor. In use, the temperature sensor measures the temperature of the magnetoresistive sensor 6. The signal outputted by the magnetoresistive sensor 6 correlates to its temperature, and, accordingly, either the magnetic flux density measurement unit 26, the signal monitoring unit 28 or the peak detection unit 30 are configured to recalibrate the signal in order to account for the change of temperature of the sensor 6. The temperature of the permanent magnets may alternatively be estimated using an electro-thermal model of the electric machine 4.

It has been described that the method of FIG. 4 may be used to identify individual permanent magnets that are demagnetised. The reduction in absolute value of a peak or trough corresponding to a permanent magnet may be accompanied by an increase in the absolute value of neighbouring peaks and troughs. Accordingly, if an electric machine is determined to be partially demagnetised, the permanent magnets corresponding to individual peaks or troughs that are adjacent peaks or troughs having an increased absolute value may be determined to be demagnetised.

The electric machine 4 has been described as being a PMSM. The PMSM may be an interior permanent magnet synchronous machine (IPMSM) or a surface permanent magnet synchronous machine (SPMSM). The electric machine 4 may alternatively be an induction machine, synchronous machine such as a brushless DC electric machine (i.e. a BLDC motor), or a flux switching machine. The electric machine 4 has been described as acting as an electric motor. However, the electric machine 4 may equally act as an electric generator. The electric machine 4 may use any type of winding, for example distributed winding or concentrated winding. The electric machine 4 may comprise any number of permanent magnets.

It has been described that a single sensor 6 is used to determine whether a fault condition exists. However, one or more additional sensors may also be used in order to improve the accuracy and/or reliability of the system and method, or to improve redundancy. The one or more additional sensors may be radially or tangentially oriented. Accordingly, a single system may comprise both radially and tangentially oriented sensors. Alternatively, each sensor may be oriented in the same manner.

Although it has been described that the electric machine 4 is switched on such that the rotor 10 rotates following initialisation, the electric machine may be switched on prior to initialisation. Similarly, whilst the above methods have been described as being carried out in an "on-line" manner whilst power is supplied to the stator 12, the methods may alternatively be carried out in an "off-line" manner with the electric machine 4 switched off. In such circumstances, the rotor 10 can be moved manually by an operator, or using an external device. The methods may also alternatively be carried out during a generating mode, in which the rotor 10 is driven such that the electric machine 4 generates electrical power.

It has been described that values of magnetic flux are measured over a single revolution of the rotor 10. However, in other arrangements, magnetic flux values over two or more revolutions of the rotor 10 may be measured. This may be particularly advantageous in the alternative method of FIG. 9, in order to produce an accurate frequency spectrum using the fast Fourier transform algorithm.

The method of FIG. 9 has been described with reference to a frequency spectrum. However, it is not necessary to derive the entirety of the frequency spectrum. The value of the frequency spectrum at frequencies other than the fundamental frequency and the characteristic frequencies may not be of interest, such that it is sufficient to derive individual values at frequencies corresponding to the fundamental frequency and characteristic frequencies.

The system and method have been described as carrying out fault detection and diagnosis over a single session. However, multiple fault detection and diagnosis sessions may be carried out over an extended period of time in order to determine the change in characteristics of the measured values of magnetic flux density. Consequently, it is possible to determine whether or not a fault condition is worsening or improving over time. For example, it may be possible to determine that a single permanent magnet is becoming more demagnetised over time, or that the demagnetisation of a single demagnetised permanent magnet is spreading to neighbouring, previously magnetised permanent magnets. It may be possible to determine the estimated remaining life of the electric machine or a permanent magnet of the electric machine 4 by determining the current condition of the magnets and the current rate of change of the condition of the magnets.

The foregoing description has described a system and method for diagnosing a demagnetisation fault condition of an electric machine. However, the system and method may be used for diagnosing other fault conditions, such as eccentricity, short circuit and bearing failure. The other fault conditions may be diagnosed using data provided by the same or a different sensor from that used to provide data for diagnosing a demagnetisation fault condition.

The system and method may be used in combination with other systems and methods for fault detection so as to form a hybrid fault detection system and method having improved accuracy and robustness. The system and method may, for example, be combined with voltage measurement systems, current measurement systems and temperature measurements systems.

The electric machine 4 may be used for any application, for example aeronautical applications, marine applications and energy and nuclear applications.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

The invention claimed is:

1. A fault diagnosis apparatus for diagnosing a fault condition in an electric machine, the electric machine comprising a rotor having an axis of rotation and comprising a plurality of permanent magnets, the fault diagnosis apparatus comprising:
   a magnetic flux density sensor which is configured such that rotation of the rotor causes each of the plurality of permanent magnets to pass the magnetic flux density sensor; and
   a processor configured to:
      measure values of magnetic flux density using the magnetic flux density sensor at a plurality of positions of the rotor;
      analyse the measured values of magnetic flux density and compare a magnitude of a peak amplitude in a time or frequency domain with a reference value; and,
      if the peak amplitude is below the reference value, determine that the electric machine has a fault condition,
   the processor being additionally configured to:
      determine the difference between the magnitude of the peak amplitude and the reference value, wherein if the electric machine is determined to have a fault condition, the severity of the fault condition is determined based on the difference.

2. A fault diagnosis apparatus according to claim 1, wherein the fault condition is demagnetisation.

3. A fault diagnosis apparatus according to claim 1, the processor being configured to compare the magnitude of a peak amplitude in a time domain with the reference value, and wherein the measured values of magnetic flux density define a plurality of peak amplitudes, each peak amplitude corresponding to one or an adjacent pair of the permanent magnets, wherein processor is also configured to compare the magnitude of each of the plurality of peak amplitudes with the reference value.

4. A fault diagnosis apparatus according to claim 3, the processor being configured to determine that the electric machine is uniformly demagnetised if all of the peak amplitudes are below the reference value, and determine that the electric machine is partially demagnetised if only some of the peak amplitudes are below the reference value.

5. A fault diagnosis apparatus according to claim 3, the processor being configured to determine the difference between one or more of the plurality of peak amplitudes corresponding to the one or adjacent pair of permanent magnets and the reference value, wherein if the one or more peak amplitudes is below the reference value, determine that the one or adjacent pair of permanent magnets is demagnetised and determine the severity of the demagnetisation based on the difference.

6. A fault diagnosis apparatus according to claim 3, wherein the sensor has an axis of measurement oriented radially towards or away from the axis of rotation, wherein each peak amplitude corresponds to one of the permanent magnets, and wherein the values of magnetic flux density corresponding to each of the peak amplitudes are measured when the axis of measurement is aligned with the permanent magnet corresponding to the peak amplitude.

7. A fault diagnosis apparatus according to claim 3, wherein the sensor has an axis of measurement oriented in a tangential direction with respect to the axis of rotation, wherein each peak amplitude corresponds to an adjacent pair of the permanent magnets, and wherein the values of magnetic flux density corresponding to each of the peak amplitudes are measured when the sensor is equally circumferentially spaced from the pair of permanent magnets corresponding to the peak amplitude.

8. A fault diagnosis apparatus according to claim 1, wherein a trigger signal causes the sensor to measure the value of magnetic flux density every 90 or 180 electrical degrees.

9. A fault diagnosis apparatus according to claim 1, wherein the magnitude of a peak amplitude in a frequency domain is compared with the reference value, and wherein the peak amplitude is at a fundamental frequency of the measured values of magnetic flux density.

10. A fault diagnosis apparatus according to claim 1, the processor being configured to compare the magnitude of a peak amplitude in a frequency domain with the reference value, the processor being further configured to:
  determine at least one diagnostic frequency;
  compare the magnitude of the frequency of the measured value of magnetic flux density at the at least one diagnostic frequency to a second reference value associated with the at least one diagnostic frequency;
  if the magnitude of the frequency of the measured value of magnetic flux density at the at least one diagnostic frequency is greater than the second reference value, determine that the electric machine is partially demagnetised, and if the magnitude of the frequency of the measured value of magnetic flux density at the at least one diagnostic frequency is less than the second reference value, determine that the electric machine is uniformly demagnetised.

11. A fault diagnosis apparatus according to claim 10, wherein the at least one diagnostic frequency is determined using the formula $$F_{DEM} = F_e\left(1 \pm \frac{k}{p}\right),$$

k=1, 2, 3 . . . where $F_{DEM}$ is the at least one diagnostic frequency, $F_e$ is the fundamental frequency, p is the number of pole pairs, and k is an integer greater than or equal to 1.

12. A fault diagnosis apparatus according to claim 10, further comprising determining the difference between the frequency of the measured value of magnetic flux density at the at least one diagnostic frequency and the second reference value, wherein if the electric machine is determined to be partially demagnetised, the severity of the partial demagnetisation is determined based on the difference.

13. A fault diagnosis apparatus according to claim 9, wherein the measured values of magnetic flux density are measured in a time domain, and wherein the time domain measurements are converted into the frequency domain using a fast Fourier transform algorithm.

14. A fault diagnosis apparatus according to claim 9, wherein the sensor has an axis of measurement oriented radially towards or way from the axis of rotation or in a tangential direction with respect to the axis of rotation.

15. A fault diagnosis apparatus according to claim 1, wherein the magnetic flux density measured using the sensor is leakage flux.

16. A fault diagnosis apparatus according to claim 1, wherein the sensor is a magnetoresistive sensor.

17. A fault diagnosis apparatus according to claim 1, wherein the electric machine is an electric motor.

18. A fault diagnosis apparatus according to claim 1, wherein the electric machine is a permanent magnet synchronous machine (PMSM).

19. A method for diagnosing a fault condition in an electric machine, the electric machine comprising a rotor having an axis of rotation and comprising a plurality of permanent magnets, the method comprising:
  rotating the rotor so that each of the plurality of permanent magnets passes a magnetic flux density sensor;
  measuring values of magnetic flux density using the magnetic flux density sensor at a plurality of positions of the rotor;
  analyzing the measured values of magnetic flux density and comparing a magnitude of a peak amplitude of magnetic flux density corresponding to each respective permanent magnet, the peak amplitude being in a time or frequency domain with a reference value of magnetic flux density; and
  if the peak amplitude is below the reference value, determining that the electric machine has a fault condition, the method further comprising:
  determining the difference between the magnitude of the peak amplitude and the reference value, wherein if the electric machine is determined to have a fault condition, the severity of the fault condition is determined based on the difference.

20. A fault diagnosis apparatus for diagnosing a fault condition in an electric machine, the electric machine comprising a rotor having an axis of rotation and comprising a plurality of permanent magnets, the fault diagnosis apparatus comprising:
  a magnetic flux density sensor which is configured such that rotation of the rotor causes each of the plurality of permanent magnets to pass the magnetic flux density sensor; and
  a processor configured to:
    measure values of magnetic flux density using the magnetic flux density sensor at a plurality of positions of the rotor so that the magnetic flux density sensor is measuring magnetic flux based on different magnets in the rotor and on different rotational positions of the rotor;
    analyze the measured values of magnetic flux density and compare a magnitude of a peak amplitude in a time or frequency domain with a reference value; and
    if the peak amplitude is below the reference value, determine that the electric machine has a fault condition,
  the processor being additionally configured to:
    determine the difference between the magnitude of the peak amplitude and the reference value, wherein if the electric machine is determined to have a fault condition, the severity of the fault condition is determined based on the difference.

* * * * *